United States Patent
Yang

(10) Patent No.: US 11,715,543 B2
(45) Date of Patent: Aug. 1, 2023

(54) MEMORY TEST CIRCUIT APPARATUS AND TEST METHOD

(71) Applicant: Changxin Memory Technologies, Inc., Anhui (CN)

(72) Inventor: Cheng-Jer Yang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 392 days.

(21) Appl. No.: 17/124,198

(22) Filed: Dec. 16, 2020

(65) Prior Publication Data

US 2021/0104289 A1   Apr. 8, 2021

Related U.S. Application Data

(63) Continuation of application No. PCT/CN2019/101883, filed on Aug. 22, 2019.

(30) Foreign Application Priority Data

Sep. 5, 2018   (CN) .......................... 201811032357.2
Sep. 5, 2018   (CN) .......................... 201821451578.9

(51) Int. Cl.
  *G11C 29/36*   (2006.01)
  *G11C 29/14*   (2006.01)
  *H03K 19/21*   (2006.01)
  *H03M 7/30*    (2006.01)

(52) U.S. Cl.
  CPC .............. *G11C 29/36* (2013.01); *G11C 29/14* (2013.01); *H03K 19/21* (2013.01); *H03M 7/30* (2013.01)

(58) Field of Classification Search
  CPC ......... G11C 29/36; G11C 29/14; G11C 29/40; G11C 29/56008; H03K 19/21; H03M 7/30
  See application file for complete search history.

(56) References Cited

U.S. PATENT DOCUMENTS

2012/0124436 A1   5/2012   Okahiro et al.
2017/0186499 A1   6/2017   Ishikawa
2018/0151248 A1   5/2018   Barowski et al.

FOREIGN PATENT DOCUMENTS

CN   108806762 A   11/2018
CN   208589269 U    3/2019

OTHER PUBLICATIONS

PCT International Search Report and the Written Opinion dated Nov. 20, 2019, issued in related International Application No. PCT/CN2019/101883 (7 pages).

*Primary Examiner* — Cynthia Britt
*Assistant Examiner* — Rong Tang
(74) *Attorney, Agent, or Firm* — Sheppard Mullin Richter & Hampton LLP

(57) ABSTRACT

A memory test circuit apparatus and a method are provided. The method may include: compressing first test data output by a first storage array in a memory to generate first compressed data, compressing second test data output by a second storage array in the memory to generate second compressed data, compressing the first compressed data and the second compressed data to generate third compressed data, and outputting one of the first compressed data, the second compressed data and the third compressed data to determine a working condition of each of the first storage array and the second storage array. This method can provide not only a test result on a memory, but also a test result for individual storage array within the memory, which improves the efficiency of a circuit test.

18 Claims, 4 Drawing Sheets

MEMORY TEST CIRCUIT APPARATUS AND TEST METHOD

CROSS-REFERENCE TO RELATED APPLICATION

This application is a continuation application of International Patent Application No. PCT/CN2019/101883, filed on Aug. 22, 2019, which is based on and claims priority of the Chinese Patent Application Nos. 201811032357.2 and 201821451578.9, both filed on Sep. 5, 2018, and entitled "MEMORY TEST CIRCUIT APPARATUS AND TEST METHOD." The above-referenced applications are incorporated herein by reference in their entirety.

TECHNICAL FIELD

This invention relates generally to the technical field of semiconductor integrated circuits (ICs), and more specifically, to a memory test circuit apparatus and a test method.

BACKGROUND

With rapid developments in IC manufacturing technologies, testing on memory chips with multiple storage arrays may generate a large amount of test data and demand tremendous processing power. Test data generated in a test generally may be compressed to reduce the data amount. Data compression refers to a technology to reduce data volume without information lost so that storage space, transmission bandwidth, and processing power may be more efficiently utilized. Data compression may also involve methods of reorganizing data according to a certain algorithm to reduce the data redundancy for more efficient storage and transmission.

To test a memory, each storage array may generate test data for testing the functionalities of the storage array. In an example shown in FIG. 1, the test data generated by each storage array 10 may go through a first data compression, conducted by four first-stage XOR gates 20, to generate compressed data D0-D3, each corresponding to compressed test data of one storage array 10. The compressed data D0-D3 may jointly go through a second data compression, conducted by a second-stage XOR gate 30, to generate an output (indicated by F in FIG. 1), which may be used to determine a working condition (normal/abnormal) of each of the storage array 10.

The aforementioned method, however, has two limitations. First, it cannot identify, from the output F, the individual storage array that generates abnormal data in the test data. Second, when test data from all the storage arrays are abnormal, the output F, which is generated after two data compression, may erroneously indicate that the test result is normal. For example, when the test data from each and every storage array 10 include abnormal data, each of the compressed data D0-D3 after the first data compression may be 1, indicating an abnormal result. However, the final output F, which is generated by compressing the data D0-D3, may be 0, indicating a normal test result. Based on the output F, the storage array 10 may be erroneously determined to be normal, which may result in a defective array being missed in a test.

The information disclosed in the Background section is merely for facilitating the understanding on the background of the invention and therefore may include information that does not constitute prior art already known to a person of ordinary skills in the art.

SUMMARY

To address the limitations of conventional technologies described above, this disclosure provides a memory test circuit apparatus and a test method.

One aspect of this disclosure is directed to a memory test circuit apparatus comprising a memory. The memory may include a first compression circuit assembly including a first compression circuit, a second compression circuit assembly including a second compression circuit, a third compression circuit, a multiplexer, and a storage array combination.

The storage array combination may include a first storage array and a second storage array. The first storage array may be configured to read initial data and output first test data, and the second storage array may be configured to read the initial data and output second test data.

The first compression circuit assembly may be configured to compress the first test data to generate first compressed data. The first compression circuit assembly may include a first input connected to the first storage array, and a first output and a second output both configured to output the first compressed data, with the second output connected to the third compression circuit.

The second compression circuit assembly may be configured to compress the second test data to generate second compressed data. The second compression circuit assembly may include a second input connected to the second storage array, and a third output and a fourth output both configured to output the second compressed data, with the third output connected to the multiplexer, and the fourth output connected to the third compression circuit.

The third compression circuit may be configured to compress the first compressed data and the second compressed data to generate third compressed data, and may comprise a fifth output connected to the multiplexer to output the third compressed data to the multiplexer.

The multiplexer may include a first input, a second input and a multiplexing output. The first input may be connected to the fifth output of the third compression circuit, the second input may be connected to the third output of the second compression circuit assembly, and the multiplexing output may be configured to output one of the second compressed data and the third compressed data.

In some embodiments, in the aforementioned apparatus, the third compression circuit may include a third input connected to the second output of the first compression circuit assembly and configured to receive the first compressed data, and a fourth input connected to the fourth output of the second compression circuit assembly and configured to receive the second compressed data.

In some embodiments, in the aforementioned apparatus, the first compression circuit assembly may further include a first transmission apparatus, and the second compression circuit assembly may further include a second transmission apparatus. The first transmission apparatus may be configured to transmit the first compressed data to the first output and the second output of the first compression circuit assembly. The second transmission apparatus may be connected to the second compression circuit, the third compression circuit and the multiplexer, and may be configured to transmit the second compressed data to the third compression circuit and the multiplexer.

In some embodiments, in the aforementioned apparatus, the first transmission apparatus may include a first transmission gate and a second transmission gate, and the second transmission apparatus may include a third transmission gate and a fourth transmission gate. The first transmission gate may be configured to transmit the first compressed data to the third compression circuit in a conducting state, the second transmission gate may be configured to output the first compressed data in a conducting state, the third transmission gate may be configured to transmit the second compressed data to the third compression circuit in a conducting state, and the fourth transmission gate may be configured to output the second compressed data to the multiplexer in a conducting state.

In some embodiments, in the aforementioned apparatus, the first compression circuit may include a first XOR gate, and the second compression circuit may include a second XOR gate.

In some embodiments, in the aforementioned apparatus, the third compression circuit may include a third XOR gate, a fourth XOR gate and an AND gate. A first input of the third XOR gate and a first input of the AND gate may be connected to the first transmission gate, a second input of the third XOR gate and a second input of the AND gate may be connected to the third transmission gate, a first input of the fourth XOR gate may be connected to an output of the third XOR gate, a second input of the fourth XOR gate may be connected to an output of the AND gate, and an output of the fourth XOR gate may be connected to the first input of the multiplexer.

In some embodiments, the aforementioned apparatus may further include a first controller and a second controller. The first controller and the second controller may both be connected to the first transmission gate, the second transmission gate, the third transmission gate and the fourth transmission gate. The first controller may be configured to turn on the second transmission gate and the fourth transmission gate, control the multiplexer to output the second compressed data, and simultaneously turn off the first transmission gate and the third transmission gate. The second controller may be configured to turn on the first transmission gate and the third transmission gate, control the multiplexer to output the third compressed data, and simultaneously turn off the second transmission gate and the fourth transmission gate.

In some embodiments, in the aforementioned apparatus, the first controller may be further connected to a control of the multiplexer. The control of the multiplexer may be configured to receive a control signal and select, according to the control signal, one of the second compressed data and the third compressed data to be output at the multiplexing output of the multiplexer.

Another aspect of this disclosure is direct to an integrated memory. The integrated memory may include a memory comprising a plurality of storage arrays, and the memory test circuit apparatus of any of the aforementioned embodiments. The memory test circuit apparatus may be connected to the memory and configured to test the memory.

Another aspect of this disclosure is direct to a memory test method. The memory test method may include: compressing first test data output by a first storage array in a memory to generate first compressed data, compressing second test data output by a second storage array in the memory to generate second compressed data, compressing the first compressed data and the second compressed data to generate third compressed data, and outputting one of the first compressed data, the second compressed data and the third compressed data to determine a working condition of each of the first storage array and the second storage array.

In some embodiments, in the aforementioned method, outputting one of the first compressed data, the second compressed data and the third compressed data may include: outputting, according to a first control signal, the first compressed data, sending the second compressed data and the third compressed data to a multiplexer, and controlling, according to a second control signal, the multiplexer to output one of the second compressed data and the third compressed data.

In some embodiments, in the aforementioned method, the compressing first test data output by a first storage array in a memory to generate first compressed data may include: compressing, by a first compression circuit assembly, the first test data to generate the first compressed data. The first compression circuit assembly may have a first input connected to the first storage array, and a first output and a second output both configured to output the first compressed data.

The compressing second test data output by a second storage array in the memory to generate second compressed data may include: compressing, by a second compression circuit assembly, the second test data to generate the second compressed data. The second compression circuit assembly may have a second input connected to the second storage array, and a third output and a fourth output both configured to output the second compression data. The third output may be connected to the multiplexer, and the fourth output may be connected to a third compression circuit.

In some embodiments, in the aforementioned method, the third compression circuit may have a third input connected to the second output of the first compression circuit assembly and configured to receive the first compressed data, and a fourth input connected to the fourth output of the second compression circuit assembly and configured to receive the second compressed data.

In some embodiments, in the aforementioned method, the first compression circuit assembly may further include a first transmission apparatus, and the second compression circuit assembly may further comprise a second transmission apparatus. The first transmission apparatus may be configured to transmit the first compressed data to the first output and the second output of the first compression circuit assembly, and the second transmission apparatus may be connected to the second compression circuit, the third compression circuit and the multiplexer, and may be configured to transmit the second compressed data to the third compression circuit and the multiplexer.

In some embodiments, in the aforementioned method, the first transmission apparatus may include a first transmission gate and a second transmission gate, and the second transmission apparatus may include a third transmission gate and a fourth transmission gate.

The first transmission gate may be configured to transmit the first compressed data to the third compression circuit while in a conducting state, the second transmission gate may be configured to output the first compressed data while in a conducting state, the third transmission gate may be configured to transmit the second compressed data to the third compression circuit while in a conducting state, and the fourth transmission gate may be configured to transmit the second compressed data to the multiplexer while in a conducting state.

In some embodiments, in the aforementioned method, the first compression circuit may include a first XOR gate, and the second compression circuit comprises a second XOR gate.

In some embodiments, in the aforementioned method, the third compression circuit may include a third XOR gate, a fourth XOR gate and an AND gate. A first input of the third XOR gate and a first input of the AND gate may be connected to the first transmission gate, a second input of the third XOR gate and a second input of the AND gate may be connected to the third transmission gate, a first input of the fourth XOR gate may be connected to an output of the third XOR gate, a second input of the fourth XOR gate may be connected to an output of the AND gate, and an output of the fourth XOR gate may be connected to the first input of the multiplexer.

In some embodiments, the aforementioned method may further comprise: turning on, by a first controller, the second transmission gate and the fourth transmission gate, and turning off, by the first controller, the first transmission gate and the third transmission gate, to control the multiplexer to output the second compressed data.

Alternatively, the aforementioned method may further comprise: turning on, by a second controller, the first transmission gate and the third transmission gate, and turning off, by the second controller, the second transmission gate and the fourth transmission gate, to control the multiplexer to output the third compressed data.

In some embodiments, the aforementioned method may further comprise: receiving, by the multiplexer, a control signal; selecting, according to the control signal, one of the second compressed data and the third compressed data as a selected signal; and outputting, at an output of the multiplexer, the selected signal.

In the memory test circuit apparatus and test method of this disclosure, first test data output by a first storage array is compressed via a first compression circuit to generate first compressed data, second test data output by a second storage array is compressed via a second compression circuit to generate second compressed data, and the first compressed data and the second compressed data may be compressed again using a third compression circuit to generate third compressed data. In the apparatus and method disclosed in this specification, not only the first compressed data can be output, one of the second compressed data and the third compressed data can also be selectively output via a multiplexer. Thus a working condition of the first storage array may be determined through the first compressed data, a working condition of the second storage array may be determined through the second compressed data, and a working condition of the memory may be determined through the third compressed data. Thus, the memory test circuit apparatus provided in this disclosure not only can provide a conclusion on whether the memory is in a normal working condition, but can also identify an individual storage array in the memory that may have an abnormal working condition.

Additionally, in the memory test circuit apparatus of this disclosure, the output of the multiplexer may be connected to a tester, so that one of the second compressed data and the third compressed data may be sent to the tester for testing. Thus, through one single connection port, the tester can test a working condition of the memory or a working condition of the individual storage array, which improves test efficiency of the tester.

The above summary is for describing the specification only and does not intend to limit the scope of this inventive concept in any manner. In addition to the above descriptions, embodiments and characteristics, embodiments and accompanying drawings will be completely and meticulously described below to fully illustrate various aspects and characteristics of this inventive concept.

BRIEF DESCRIPTION OF THE DRAWINGS

The accompanying drawings, which are incorporated in and constitute a part of the description, illustrate embodiments in accordance with this disclosure and, together with the description, serve to explain the disclosed inventive concept. It is apparent that these drawings present only some embodiments of the present inventive concept and persons of ordinary skill in the art may obtain drawings of other embodiments from them without creative effort. In the accompanying drawings, unless otherwise specified, same numerals throughout multiple accompanying drawings represent same or similar parts or elements.

NUMERALS IN THE DRAWINGS

Background

Figure 1:
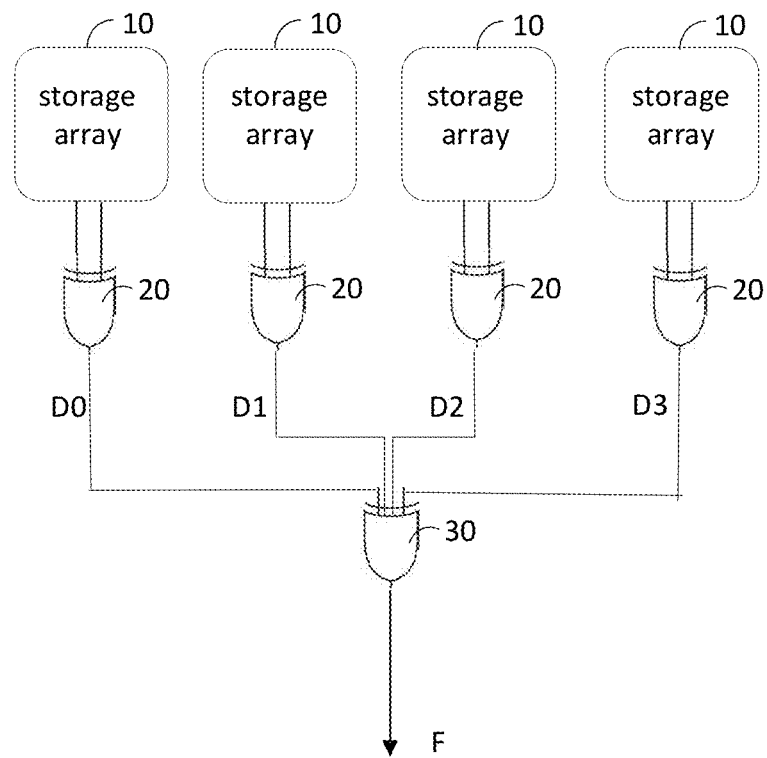
FIG. 1 depicts a schematic diagram of a conventional memory test circuit apparatus.

10: storage array; 20: first-stage XOR gate; 30: second-stage XOR gate.

Embodiment 1

1: memory;
11: first test interface; 22: second test interface;
100: storage array combination;
110: first storage array; 120: second storage array;
210: first compression circuit assembly;
213: first input of the first compression circuit assembly;
214: first output of the first compression circuit assembly;
215: second output of the first compression circuit assembly;
220: second compression circuit assembly;
223: second input of the second compression circuit assembly;
224: third output of the second compression circuit assembly;
225: fourth output of the second compression circuit assembly;
300: third compression circuit;
301: third input of the third compression circuit;
302: fourth input of the third compression circuit;
303: fifth output of the third compression circuit;
400: multiplexer;
401: first input of the multiplexer; 402: second input of the multiplexer;
403: multiplexing output; 404: multiplexer control of the multiplexer.

Embodiment 2

201: first compression circuit; 202: second compression circuit;
211: first XOR gate; 212: second XOR gate;
230: first transmission apparatus; 240: second transmission apparatus;
231: first transmission gate; 232: second transmission gate;
241: third transmission gate; 242: fourth transmission gate;
510: first controller; 520: second controller.

Embodiment 3

130: third storage array; 140: fourth storage array;
221: fifth XOR gate; 222: sixth XOR gate;
250: third transmission gate; 260: fourth transmission gate;
310: sixth compression circuit.

DETAILED DESCRIPTION OF THE EMBODIMENTS

Only some exemplary embodiments are described. As those skilled in the art would realize, the described embodiments may be modified in various different ways without departing from the spirit or scope of the present invention. Therefore, the accompanying drawings and description are considered as being substantively illustrative but not restrictive.

In the description of the present invention, it should be understood that, orientation or positional relationships indicated by the terms "center", "longitudinal", "transversal", "length", "width", "thickness", "upper", "lower", "front", "rear", "left", "right", "vertical", "horizontal", "top", "bottom", "inner", "outer", "clockwise", "counterclockwise", "axial", "radial", "peripheral", etc. are based on the orientation or positional relationships as shown in the drawings, for ease of the description of the present invention and simplifying the description only, and do not indicate or imply that the indicated device or element must have a particular orientation or be constructed and operated in a particular orientation. Therefore, these terms should not be understood as a limitation to the present invention.

In addition, the terms such as "first" and "second" are merely for a descriptive purpose, and cannot be understood as indicating or implying relative importance, or implicitly indicating the number of the indicated technical features. Hence, the features defined by "first" and "second" can explicitly or implicitly include one or more features. In the description of the present invention, "a plurality of" means two or more, unless otherwise stated.

In the description of the present invention, unless otherwise specified and defined explicitly, the terms such as "install", "connected with", "connected to" and "fixed" should be comprehended in a broad sense. For example, these terms may be comprehended as being fixedly connected, detachably connected or integrally connected; mechanically connected, electrically connected or communicated; or directly connected or indirectly connected through an intermediate medium, or in an internal communication between two elements or an interactive relationship between two elements. The specific meanings about the foregoing terms in the present invention may be understood by those of ordinary skill in the art according to specific circumstances.

In the present invention, unless otherwise specified and defined explicitly, the first feature is "above" or "below" the second feature, which may include that the first feature and the second feature are in direct contact, and may also include that the first feature and the second feature are not in direct contact but are in contact via another feature therebetween. Moreover, the first feature is "above", "over" and "on" the second feature, which includes that the first feature is above the second feature and at an inclined top of the second feature, or only indicates that a horizontal height of the first feature is higher than a horizontal height of the second feature. The first feature is "below", "underneath" and "under" the second feature, which includes that the first feature is below the second feature and at an inclined bottom of the second feature, or only indicates that a horizontal height of the first feature is smaller than a horizontal height of the second feature.

Many different embodiments or examples are provided below to implement different structures of the present invention. In order to simplify the present invention, the components and arrangements for special examples are described below. Certainly, they are merely some non-exclusive examples and are not intended to limit the present invention. Additionally, reference numbers and/or reference letters may be repeated in different examples of the present invention, and such a repetition is for the purposes of simplicity and clarity, and does not indicate a relationship between the discussed embodiments and/or arrangements. Although examples on various specific processes and materials are provided in the present invention, those of ordinary skill in the art may include applications of other processes and/or use of other materials without creative effort.

Embodiment 1

Figure 2:
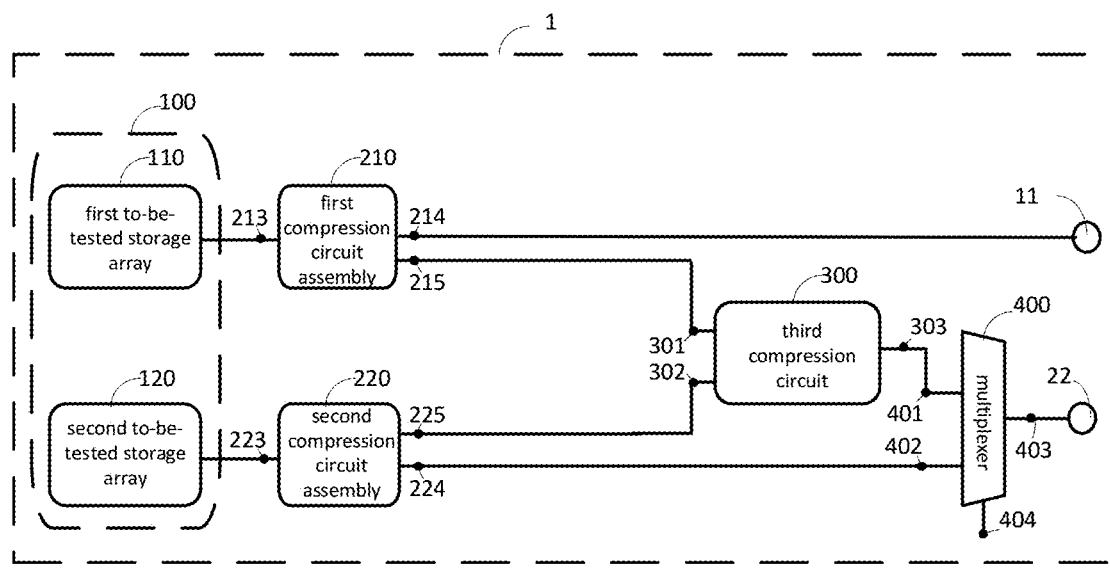
FIG. 2 depicts a block diagram of a memory test circuit apparatus in accordance with one embodiment of this disclosure.
Figure 3:
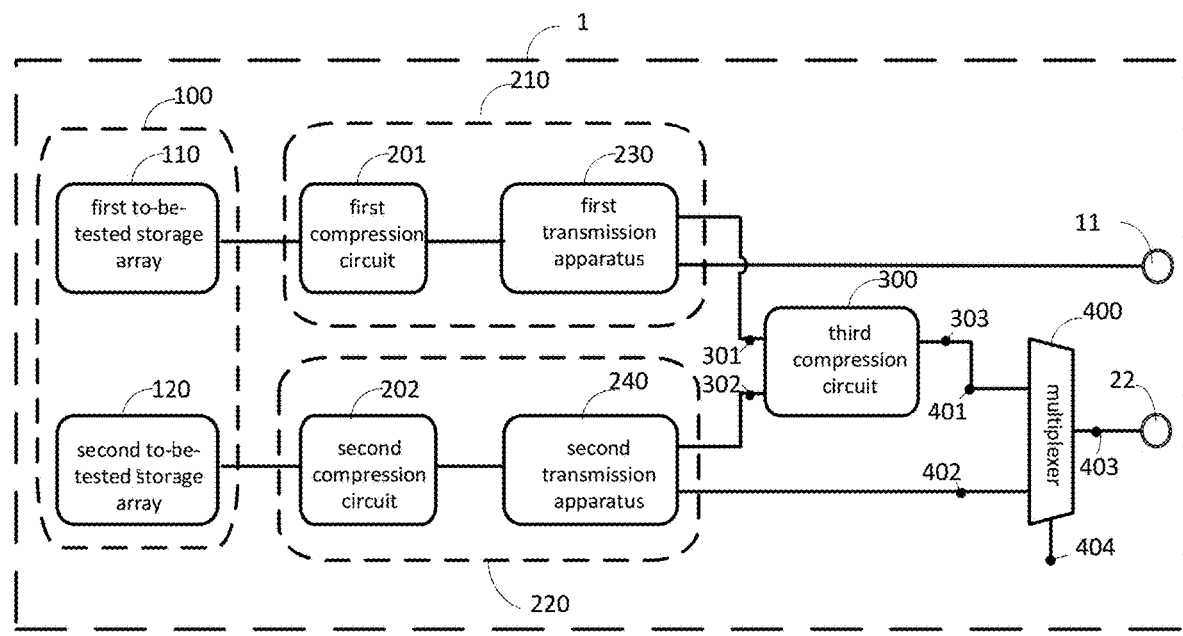
FIG. 3 depicts a block diagram of another memory test circuit apparatus in accordance with one embodiment of this disclosure.

FIGS. 2 and 3 depict block diagrams of memory test circuit apparatus in accordance with one or more embodiments of this disclosure.

Referring to FIG. 2, in one embodiment, a memory test circuit apparatus of this disclosure may be installed in a memory 1, and may include a storage array combination 100, a first compression circuit assembly 210, a second compression circuit assembly 220, a third compression circuit 300, and a multiplexer 400.

Referring to FIG. 3, the first compression circuit assembly 210 may include a first compression circuit 201, and the second compression circuit assembly 220 may include a second compression circuit 202.

A first storage array 110 and a second storage array 120 may be disposed in the storage array combination 100. The first storage array 110 may be configured to read initial data and output first test data to the first compression circuit 201. The second storage array 120 may be configured to read the initial data and output second test data to the second compression circuit 202.

The first compression circuit assembly 210 may be configured to compress the first test data to generate first compressed data, based on which a working condition of the first storage array 110 may be determined. In this disclosure, a working condition of a storage array or a memory may be normal if the storage array is determined to be working normally (indicating that the array or chip passes a test), or abnormal if the storage array is determined to be working abnormally (indicating that the array or chip fails to pass a test).

Referring to FIG. 2, the first compression circuit assembly 210 may include a first input 213 connected to the first storage array 110, a first output 214 and a second output 215 both configured to output the first compressed data, with the second output 215 connected to the third compression circuit 300.

The second compression circuit assembly 220 may be configured to compress the second test data to generate second compressed data, based on which a working condition of the second storage array 120 may be determined. The second compression circuit assembly 220 may include a second input 223 connected to the second storage array 120, a third output 224 and a fourth output 225 both configured to output the second compressed data, with the third output 224 connected to the multiplexer 400, and the fourth output 225 connected to the third compression circuit 300.

The third compression circuit 300 may be configured to compress one or both of the first compressed data and the second compressed data to generate third compressed data. The third compression circuit 300 may include a fifth output 303 connected to the multiplexer 400 to output the third compressed data to the multiplexer 400. The third compression circuit 300 may further include a third input 301, connected to the second output 215 of the first compression circuit assembly 210 and configured to receive the first compressed data. The third compression circuit 300 may further include a fourth input 302, connected to the fourth output 225 of the second compression circuit assembly 220 and configured to receive the second compressed data.

The multiplexer 400 may include a first input 401, a second input 402, a multiplexing output 403, and a multiplexer control 404. The first input 401 may be connected to the fifth output 303 of the third compression circuit 300, and the second input 402 may be connected to the third output 224 of the second compression circuit assembly 220. The multiplexer control 404 of the multiplexer 400 may be configured to receive a control signal, and output, according to the control signal, one of the second compressed data and the third compressed data at the multiplexing output 403 of the multiplexer 400. The third compressed data may be used for determining a working condition of the memory 1.

The first output 214 of the first compression circuit assembly 210 may be connected to a first test interface 11, and may be connected to a tester via the first test interface 11. The tester may be any tester known to persons of ordinary skill in the art. The tester may determine a working condition of the first storage array via the first compressed data. The multiplexing output 403 may be connected to a second test interface 22, and may be connected to the tester via the second test interface 22. The tester may determine a working condition of the second storage array 120 and a working condition of the memory 1 via the second compressed data and/or the third compressed data.

A tester may have a limited number of available test ports. Therefore, with the memory test circuit apparatus of this embodiment, the utilization rate for each test port of the tester may be improved. Through two outputs, a failure test not only can be performed on the memory 1, but can also be performed on each individual storage array (e.g., the first storage array 110 and the second storage array 120) within the memory 1. Therefore, the position of a defective storage array can be accurately identified and the test efficiency can be improved.

It is to be noted that individual storage arrays inside the storage array combination 100 may include, but not limit to, the first storage array 110 and the second storage array 120 in the above embodiment, and may further include more storage arrays. The number of the storage arrays may be determined by the internal storage capacity of the memory 1, and is not limited herein. The memory test circuit apparatus disclosed herein may be a stand-alone circuit for testing a memory, it may also be integrated into a memory and be connected to and configured to test the memory. This invention is not limited in this regard.

It is to be noted that the first compression circuit 201 is only one of the embodiments of the first compression circuit assembly 210 of this disclosure, the second compression circuit 202 is only one of the embodiments of the second compression circuit assembly 220 of this disclosure. Other circuits capable of implementing a compression function are contemplated and may fall within the protection scope of this disclosure.

Embodiment 2

Referring to FIG. 3, in some embodiments, the first compression circuit assembly 210 may further include a first transmission apparatus 230, and the second compression circuit assembly 220 may further include a second transmission apparatus 240. The first transmission apparatus 230 may be connected to the first compression circuit 201, and may be configured to transmit the first compressed data to the first output of the first compression circuit assembly 210 and the second output of the first compression circuit assembly 210. The second transmission apparatus 240 may be connected to the second compression circuit 202, the third compression circuit 300 and the multiplexer 400, and may be configured to transmit the second compressed data to the third compression circuit 300 and the multiplexer 400.

Figure 4:
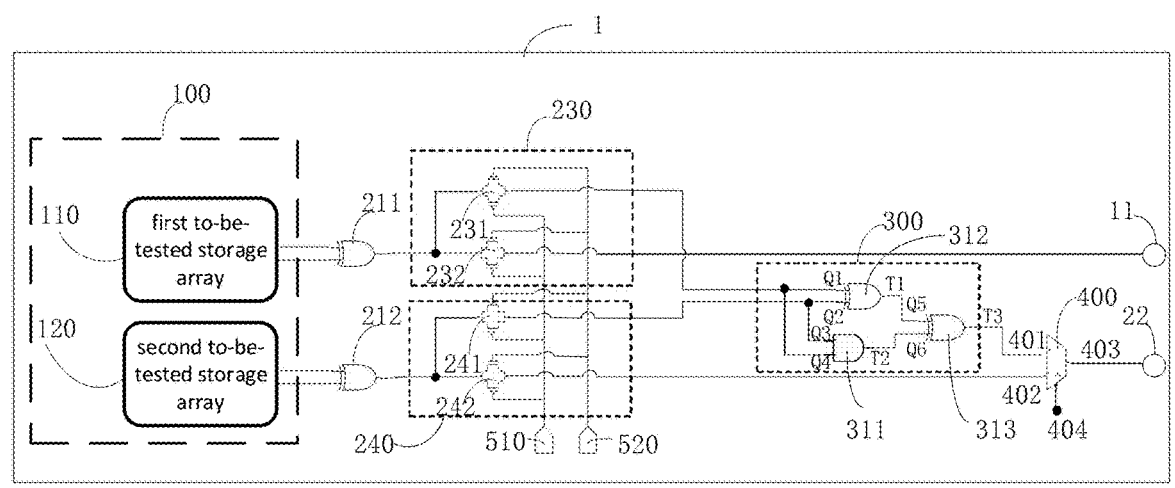
FIG. 4 depicts a schematic diagram of a memory test circuit apparatus in accordance with one embodiment of this disclosure.

FIG. 4 depicts a schematic diagram of a memory test circuit apparatus in accordance with one embodiment of this disclosure. Referring to FIG. 4, the first compression circuit 201 may include a first XOR gate 211, and the second compression circuit 202 may include a second XOR gate 212. The first transmission apparatus 230 may include a first transmission gate 231 and a second transmission gate 232, and the second transmission apparatus 240 may include a third transmission gate 241 and a fourth transmission gate 242. The first transmission gate 231 may be configured to transmit the first compressed data to the third compression circuit 300 while in a conducting state, the second transmission gate 232 may be configured to output the first compressed data while in a conducting state, the third transmission gate 241 may be configured to transmit the second compressed data to the third compression circuit 300 while in a conducting state, and the fourth transmission gate 242 may be configured to transmit the second compressed data to the multiplexer 400 while in a conducting state.

It is to be noted that, in some embodiments, the first compression circuit 201 and the first transmission apparatus 230 may jointly form the first compression circuit assembly 210, and the second compression circuit 202 and the second transmission apparatus 240 may jointly form the second compression circuit assembly 220.

Referring to FIG. 4, the third compression circuit 300 may include a third XOR gate 312, a fourth XOR gate 313 and an AND gate 311. A first input (Q1) of the third XOR gate 312 and a first input (Q4) of the AND gate 311 may be connected to an output of the first transmission gate 231. A second input (Q2) of the third XOR gate 312 and a second input (Q3) of the AND gate 311 may be connected to an output of the third transmission gate 241. A first input (Q5) of the fourth XOR gate 313 may be connected to an output T1 of the third XOR gate 312, and a second input (Q6) of the fourth XOR gate 313 may be connected to an output T2 of the AND gate 311. An output T3 of the fourth XOR gate 313 may be connected to the first input 401 of the multiplexer 400.

It is to be noted that the first compression circuit 201 may include, but not limit to, the first XOR gate 211 in the above embodiment, the second compression circuit 202 may include, but not limit to, the second XOR gate 212 in the above embodiment, and the third compression circuit 300 may include, but not limit to, the devices and connection manners provided in the above embodiments. The compression circuits may include other types of devices and connection manners that are capable of implementing data compression functions, and these types of devices and connection manners may all fall within the protection scope of this disclosure.

As shown in FIG. 4, the memory test circuit apparatus may further include a first controller 510 and a second controller 520. The first controller 510 and the second controller 520 may both be connected to the first transmission gate 231, the second transmission gate 232, the third transmission gate 241 and the fourth transmission gate 242.

Figure 6:
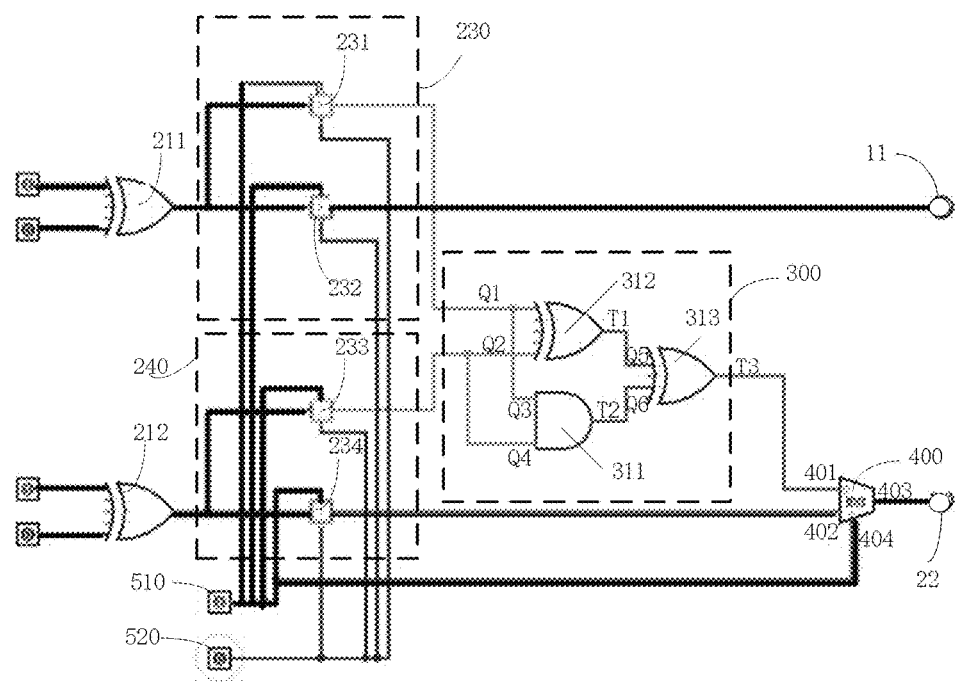
FIG. 6 depicts a schematic diagram of a memory test circuit apparatus in accordance with one embodiment of this disclosure.

FIG. 6 depicts a schematic diagram of a memory test circuit apparatus in accordance with one embodiment of this disclosure. Referring to FIG. 6, the first controller 510 may be configured to turn on the second transmission gate 232 to output the first compressed data. The first controller 510 may be further configured to turn on the fourth transmission gate 242, and multiplexer control 404 the multiplexer 400 to output the second compressed data. Meanwhile, the first controller 510 may be further configured to turn off the first transmission gate 231 and the third transmission gate 241, thus preventing the third compression circuit 300 from compressing the first compressed data and the second compressed data.

Figure 7:
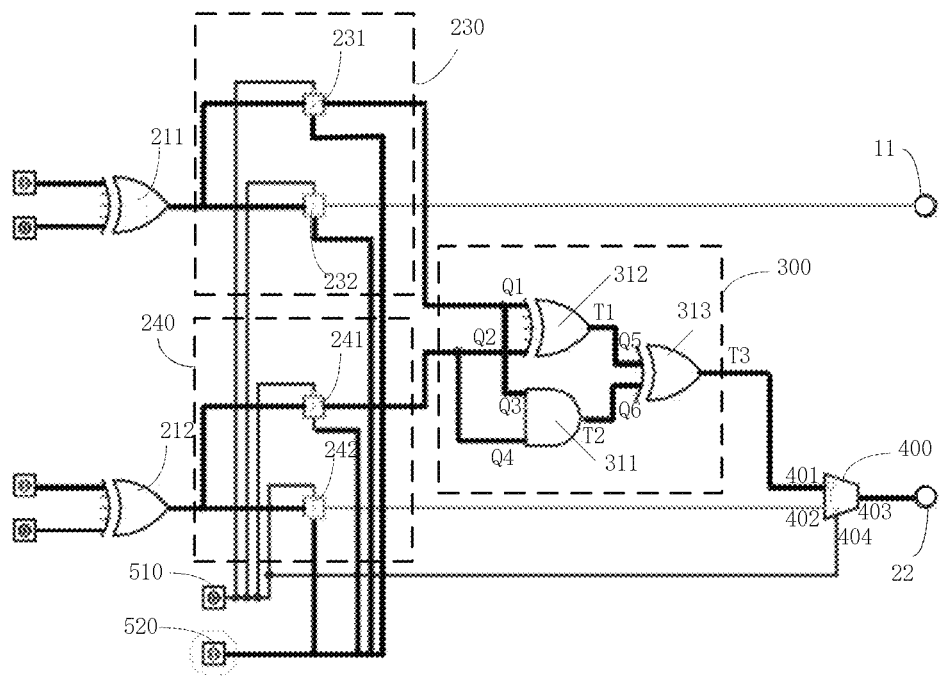
FIG. 7 depicts a schematic diagram of another memory test circuit apparatus in accordance with one embodiment of this disclosure.

FIG. 7 depicts a schematic diagram of another memory test circuit apparatus in accordance with one embodiment of this disclosure. Referring to FIG. 7, the second controller 520 may be configured to turn on the first transmission gate 231 and the third transmission gate 241 so as to allow the first compressed data and the second compressed data to be sent to the third compression circuit 300 to be further compressed to generate the third compressed data that will be input to the multiplexer 400. The second controller 520 may be further configured to control the multiplexer 400 to output the third compressed data. Meanwhile, the second controller 520 may be further configured to turn off the second transmission gate 232 and the fourth transmission gate 242, thus preventing the first compressed data and the second compressed data from being output directly.

In some embodiments, the first controller 510 may be further connected to the multiplexer control 404 of the multiplexer, and the multiplexer output 404 of the multiplexer may be configured to, according to a control signal, select one of the second compressed data and the third compressed data and output the selected signal at the multiplexing output 403 of the multiplexer 400.

Embodiment 3

Figure 5:
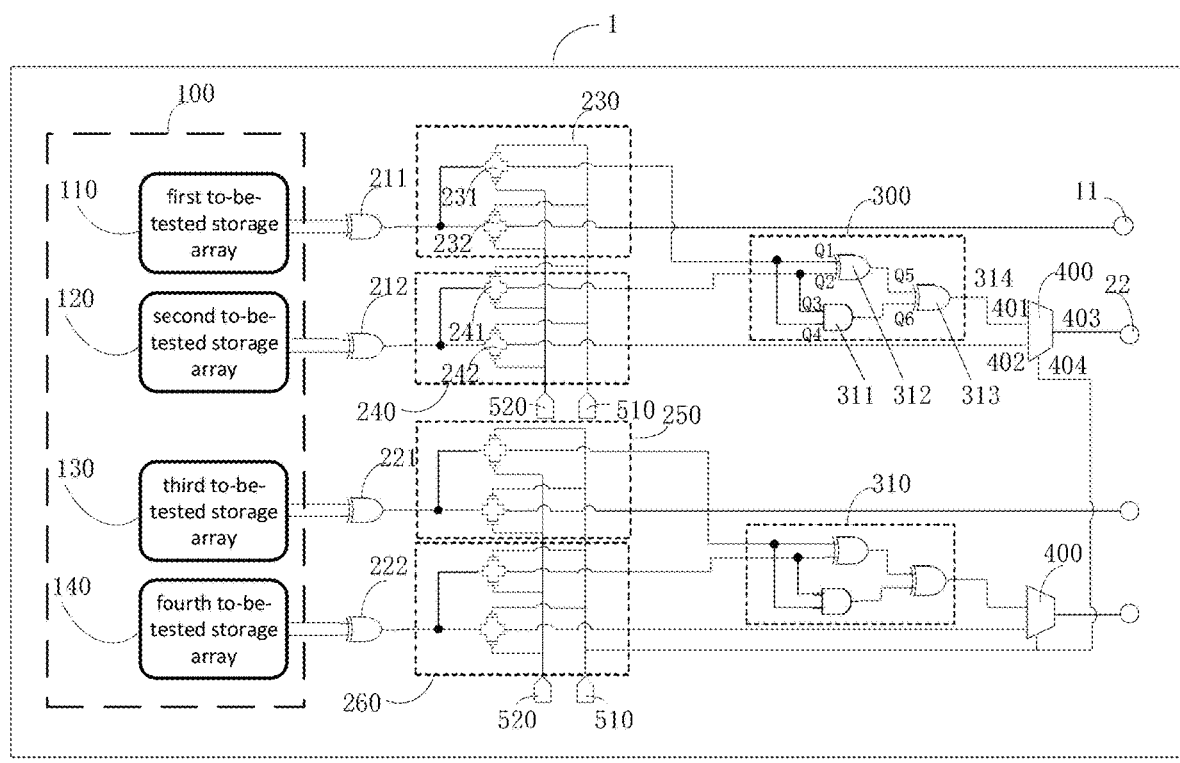
FIG. 5 depicts a schematic diagram of another memory test circuit apparatus in accordance with one embodiment of this disclosure.

FIG. 5 depicts a schematic diagram of another memory test circuit apparatus in accordance with one embodiment of this disclosure. Referring to FIG. 5, in some embodiments, a plurality of memory test circuit apparatus described in the aforementioned embodiments may be provided. The plurality of memory test circuit apparatus may include, in addition to the components disclosed in the aforementioned embodiments, a third storage array 130, a fourth storage array 140, a fifth XOR gate 221, a sixth XOR gate 222, a third transmission apparatus 250, a fourth transmission apparatus 260, a sixth compression circuit 310 and a multiplexer 400. The fifth XOR gate 221 and the sixth XOR gate 222 may perform a first-stage compression on the data from the third storage array 130 and the fourth storage array 140, respectively, and the sixth compression circuit 310 may perform a second-stage compression. The connection manners of the these devices are the same as those described in the aforementioned embodiments and thus will not be repeated herein.

In the above embodiment, a new set of memory test circuit apparatus is added to the apparatus disclosed in some embodiments (e.g., in FIG. 4). It is to be noted that this disclosure is not limited herein, and the number of the memory test circuit apparatus and connection manners may be adaptively adjusted according to the number of test ports of the tester and other actual conditions, all of which may fall within the protection scope of this disclosure.

Embodiment 4

Figure 8:
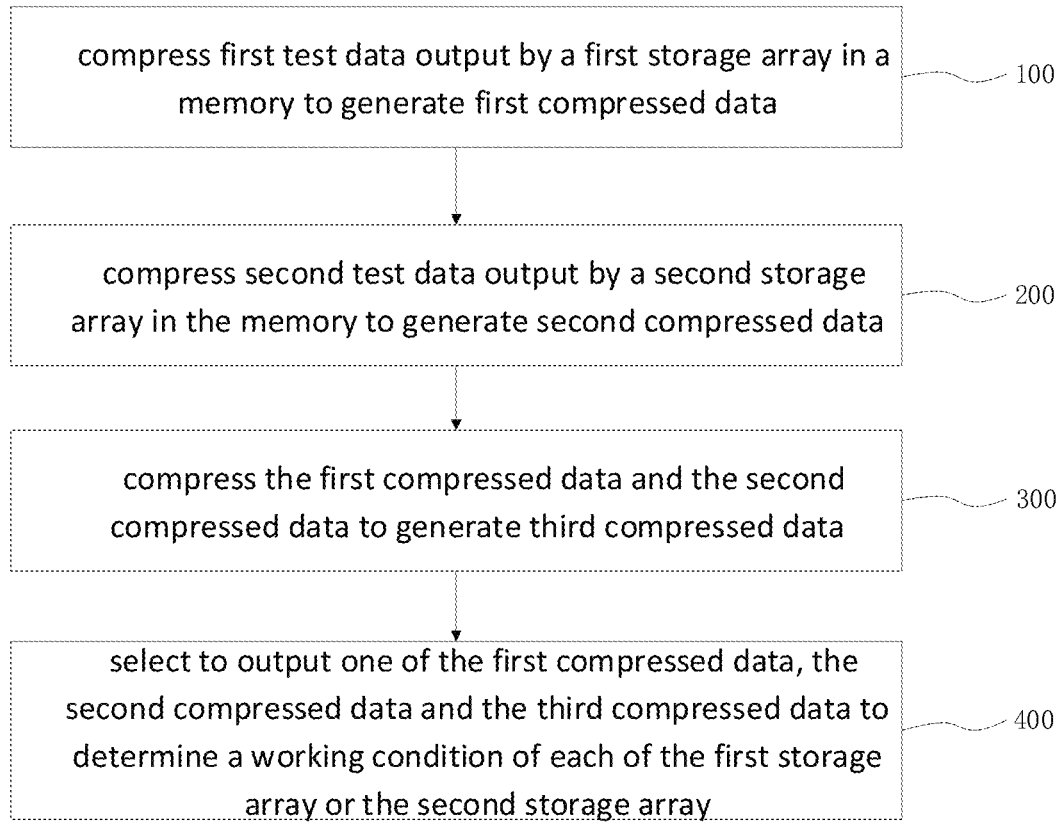
FIG. 8 depicts a flowchart of a memory test method in accordance with one embodiment of this disclosure.

FIG. 8 depicts a flowchart of a memory test method in accordance with one embodiment of this disclosure. Referring to FIG. 8, a memory test method is provided. The memory test method may utilize the memory test circuit apparatus provided in the aforementioned embodiments. As shown in FIG. 8, the memory test method may include the following steps 100 through 400.

In step 100, first test data output by a first storage array in a memory may be compressed to generate first compressed data.

In step 200, second test data output by a second storage array in the memory may be compressed to generate second compressed data.

In step 300, the first compressed data and the second compressed data may be compressed to generate third compressed data.

In step 400, one of the first compressed data, the second compressed data and the third compressed data may be selected to output to determine a working condition of each of the first storage array, the second storage array, or the memory.

In the above memory test method, the step of selecting one of the first compressed data, the second compressed data and the third compressed data to output may include the following steps.

First, according to a first control signal, the first compressed data may be output.

Second, the second compressed data and the third compressed data may be sent to a multiplexer.

Third, according to a second control signal, the multiplexer is controlled to output one of the second compressed data and the third compressed data.

Only some specific embodiments of this inventive concept are disclosed herein, other embodiments of this inventive concept will be apparent to those skilled in the art by considering the specification and practicing the inventive concept disclosed herein. Accordingly, the protection scope of this disclosure is intended to cover all and any variations, uses, or adaptations of this inventive concept which follow, in general, the principles thereof and include such departures from this inventive concept as come within common knowledge or customary practice within the art to which the inventive concept pertains. It is also intended that the specification and examples be considered as exemplary only, with true scope and spirit of this inventive concept being indicated by the appended claims.

The invention claimed is:

1. A memory test circuit apparatus for testing a memory comprising a first storage array and a second storage array, comprising:
   a first compression circuit assembly comprising a first compression circuit;
   a second compression circuit assembly comprising a second compression circuit;
   a third compression circuit; and
   a multiplexer;
   wherein the first compression circuit assembly is configured to compress first test data to generate first compressed data, and comprises a first input connected to the first storage array, and a first output and a second output both configured to output the first compressed data, with the second output connected to the third compression circuit,
   wherein the second compression circuit assembly is configured to compress second test data to generate second compressed data, and comprises a second input connected to the second storage array, and a third output and a fourth output both configured to output the second compressed data, with the third output connected to the multiplexer, and the fourth output connected to the third compression circuit,
   wherein the third compression circuit is configured to compress the first compressed data and the second compressed data to generate third compressed data, and comprises a fifth output connected to the multiplexer to output the third compressed data to the multiplexer,
   and wherein the multiplexer has a first input connected to the fifth output of the third compression circuit, a second input connected to the third output of the second compression circuit assembly and a multiplexing output configured to output one of the second compressed data and the third compressed data.

2. The apparatus of claim 1, wherein the third compression circuit comprises a third input connected to the second output of the first compression circuit assembly and configured to receive the first compressed data, and a fourth input connected to the fourth output of the second compression circuit assembly and configured to receive the second compressed data.

3. The apparatus of claim 1, wherein the first compression circuit assembly further comprises a first transmission apparatus, and the second compression circuit assembly further comprises a second transmission apparatus,
   wherein the first transmission apparatus is configured to transmit the first compressed data to the first output and the second output of the first compression circuit assembly,
   and wherein the second transmission apparatus is connected to the second compression circuit, the third compression circuit and the multiplexer, and is configured to transmit the second compressed data to the third compression circuit and the multiplexer.

4. The apparatus of claim 3, wherein the first transmission apparatus comprises a first transmission gate and a second transmission gate, and the second transmission apparatus comprises a third transmission gate and a fourth transmission gate,
   wherein the first transmission gate is configured to transmit the first compressed data to the third compression circuit while in a conducting state, the second transmission gate is configured to output the first compressed data while in a conducting state, the third transmission gate is configured to transmit the second compressed data to the third compression circuit while in a conducting state, and the fourth transmission gate is configured to transmit the second compressed data to the multiplexer while in a conducting state.

5. The apparatus of claim 3, wherein the first compression circuit comprises a first XOR gate, and the second compression circuit comprises a second XOR gate.

6. The apparatus of claim 4, wherein the third compression circuit comprises a third XOR gate, a fourth XOR gate and an AND gate, a first input of the third XOR gate and a first input of the AND gate connected to the first transmission gate, a second input of the third XOR gate and a second input of the AND gate connected to the third transmission gate, a first input of the fourth XOR gate connected to an output of the third XOR gate, a second input of the fourth XOR gate connected to an output of the AND gate, and an output of the fourth XOR gate connected to the first input of the multiplexer.

7. The apparatus of claim 4, further comprising:
   a first controller and a second controller, the first controller and the second controller both connected to the first transmission gate, the second transmission gate, the third transmission gate and the fourth transmission gate,
   wherein the first controller is configured to turn on the second transmission gate and the fourth transmission gate, control the multiplexer to output the second compressed data, and simultaneously turn off the first transmission gate and the third transmission gate,
   and wherein the second controller is configured to turn on the first transmission gate and the third transmission gate, control the multiplexer to output the third compressed data, and simultaneously turn off the second transmission gate and the fourth transmission gate.

8. The apparatus of claim 7, wherein the first controller is further connected to a control of the multiplexer, wherein the control of the multiplexer is configured to receive a control signal and select, according to the control signal, one of the second compressed data and the third compressed data to be output at the multiplexing output of the multiplexer.

9. An integrated memory, comprising:
   a memory comprising a plurality of storage arrays; and
   the memory test circuit apparatus of claim 1 connected to the memory and configured to test the memory.

10. A memory test method, comprising:
    compressing, by a first compression circuit assembly, first test data output by a first storage array in a memory to generate first compressed data, the first compression circuit assembly comprising a first input connected to the first storage array, and a first output and a second output both configured to output the first compressed data;
    compressing, by a second compression circuit assembly, second test data output by a second storage array in the memory to generate second compressed data, the second compression circuit assembly comprising a second input connected to the second storage array, and a third output and a fourth output both configured to output the second compression data, the third output connected to a multiplexer, the fourth output connected to a third compression circuit;
    compressing the first compressed data and the second compressed data to generate third compressed data; and
    outputting one of the first compressed data, the second compressed data, and the third compressed data to determine a working condition of each of the first storage array and the second storage array.

11. The method of claim 10, wherein outputting one of the first compressed data, the second compressed data and the third compressed data comprises:
outputting, according to a first control signal, the first compressed data;
sending the second compressed data and the third compressed data to a multiplexer; and
controlling, according to a second control signal, the multiplexer to output one of the second compressed data and the third compressed data.

12. The method of claim 10, wherein the third compression circuit comprises a third input connected to the second output of the first compression circuit assembly and configured to receive the first compressed data, and a fourth input connected to the fourth output of the second compression circuit assembly and configured to receive the second compressed data.

13. The method of claim 10, wherein the first compression circuit assembly further comprises a first transmission apparatus, and the second compression circuit assembly further comprises a second transmission apparatus,
wherein the first transmission apparatus is configured to transmit the first compressed data to the first output and the second output of the first compression circuit assembly, and
wherein the second transmission apparatus is connected to the second compression circuit, the third compression circuit and the multiplexer, and is configured to transmit the second compressed data to the third compression circuit and the multiplexer.

14. The method of claim 13, wherein the first transmission apparatus comprises a first transmission gate and a second transmission gate, and the second transmission apparatus comprises a third transmission gate and a fourth transmission gate,
wherein the first transmission gate is configured to transmit the first compressed data to the third compression circuit while in a conducting state, the second transmission gate is configured to output the first compressed data while in a conducting state, the third transmission gate is configured to transmit the second compressed data to the third compression circuit while in a conducting state, and the fourth transmission gate is configured to transmit the second compressed data to the multiplexer while in a conducting state.

15. The method of claim 13, wherein the first compression circuit comprises a first XOR gate, and the second compression circuit comprises a second XOR gate.

16. The method of claim 14, wherein the third compression circuit comprises a third XOR gate, a fourth XOR gate and an AND gate, a first input of the third XOR gate and a first input of the AND gate connected to the first transmission gate, a second input of the third XOR gate and a second input of the AND gate connected to the third transmission gate, a first input of the fourth XOR gate connected to an output of the third XOR gate, a second input of the fourth XOR gate connected to an output of the AND gate, and an output of the fourth XOR gate connected to the first input of the multiplexer.

17. The method of claim 14, further comprising:
turning on, by a first controller, the second transmission gate and the fourth transmission gate, and turning off, by the first controller, the first transmission gate and the third transmission gate, to control the multiplexer to output the second compressed data; or
turning on, by a second controller, the first transmission gate and the third transmission gate, and turning off, by the second controller, the second transmission gate and the fourth transmission gate, to control the multiplexer to output the third compressed data.

18. The method of claim 17, further comprising:
receiving, by the multiplexer, a control signal;
selecting, according to the control signal, one of the second compressed data and the third compressed data as a selected signal; and
outputting, at an output of the multiplexer, the selected signal.

* * * * *